(12) United States Patent
Suzuki

(10) Patent No.: US 11,250,789 B2
(45) Date of Patent: Feb. 15, 2022

(54) DISPLAY DEVICE AND MANUFACTURING METHOD THEREFOR

(71) Applicant: SHARP KABUSHIKI KAISHA, Sakai (JP)

(72) Inventor: Nobuhiko Suzuki, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 17/042,903

(22) PCT Filed: Mar. 30, 2018

(86) PCT No.: PCT/JP2018/013841
§ 371 (c)(1),
(2) Date: Sep. 28, 2020

(87) PCT Pub. No.: WO2019/187085
PCT Pub. Date: Oct. 3, 2019

(65) Prior Publication Data
US 2021/0056914 A1    Feb. 25, 2021

(51) Int. Cl.
*G09G 3/3275* (2016.01)
*H01L 27/32* (2006.01)
*G09G 3/3266* (2016.01)

(52) U.S. Cl.
CPC ......... *G09G 3/3275* (2013.01); *G09G 3/3266* (2013.01); *H01L 27/3276* (2013.01); *H01L 2227/323* (2013.01)

(58) Field of Classification Search
CPC .... G09G 3/006; G09G 3/3275; G09G 3/3266; G09G 3/3233; H01L 27/3276
See application file for complete search history.

(56) References Cited

U.S. PATENT DOCUMENTS

| 2005/0258769 | A1 | 11/2005 | Imamura |
| 2006/0139254 | A1 | 6/2006 | Hayakawa et al. |
| 2011/0279441 | A1 | 11/2011 | Hayakawa et al. |
| 2015/0379927 | A1 | 12/2015 | Cai |
| 2017/0269398 | A1* | 9/2017 | Park ............... H01L 27/3276 |

FOREIGN PATENT DOCUMENTS

| JP | H09-61458 A | 3/1997 |
| JP | 2004-258489 A | 9/2004 |
| JP | 2005-331744 A | 12/2005 |
| JP | 2006-048011 A | 2/2006 |
| JP | 2010-086640 A | 4/2010 |

* cited by examiner

*Primary Examiner* — Sardis F Azongha
(74) *Attorney, Agent, or Firm* — ScienBiziP, P.C.

(57) ABSTRACT

A display device including a display region and a frame region and configured to display an image by causing first light-emitting elements provided in the display region to emit light, the display device includes: a plurality of data lines to which data signals are supplied; a plurality of control lines arranged to intersect the plurality of data lines; a plurality of pixel circuits including the first light-emitting elements, each of the first light-emitting elements being provided at each of intersection points of the plurality of data lines and the plurality of control lines; a control circuit configured to activate the plurality of corresponding control lines; and second light-emitting elements provided in the frame region, wherein electrical signals flowing through the plurality of control lines or electrical signals flowing through nodes provided in the control circuit are input to the second light-emitting elements.

13 Claims, 11 Drawing Sheets

(a)

(b)

(a)

(b)

EXPECTED LIGHT EMISSION
WAVEFORM FROM CONTROL LINE 8(n)

EXPECTED LIGHT EMISSION
WAVEFORM FROM CONTROL LINE 8(n - 1)

MEASURED WAVEFORM

EXPECTED LIGHT EMISSION WAVEFORM

MEASURED WAVEFORM

DISPLAY DEVICE AND MANUFACTURING METHOD THEREFOR

TECHNICAL FIELD

The disclosure is related to a display device and a manufacturing method therefor.

BACKGROUND ART

A display device in which a light-emitting element such as an organic EL element constitutes a pixel includes a control circuit configured to perform electrical control on the pixels to display an image. The control circuit includes, for example, a scanning line drive circuit, and these control circuits require precise action. Therefore, there is a need to inspect whether or not a fault has occurred in the control circuit. As a known inspection means, an electrical signal is measured by bringing an inspection probe into direct contact with an internal node of interest from above a sealing resin (PTL 1).

CITATION LIST

Patent Literature

PTL 1: JP 09-061458 A

SUMMARY

Technical Problem

However, thinner display devices have undergone significant development in recent years, and display devices built on flexible substrates have also been developed, so the display devices have been poor in flattening during inspection, and thus, it has been difficult to accurately bring the inspection probe into contact with the node of interest.

Solution to Problem

Then, as a solution of the above problem, a display device according to the disclosure is a display device including a display region and a frame region provided around the display region and configured to display an image by causing first light-emitting elements provided in the display region to emit light, the display device including a plurality of data lines to which data signals for displaying the image are supplied, a plurality of control lines arranged to intersect the plurality of data lines, a plurality of pixel circuits including the first light-emitting elements, each of the first light-emitting elements being provided at each of intersection points of the plurality of data lines and the plurality of control lines, a control circuit configured to activate the plurality of corresponding control lines at a timing at which the data signals are supplied to the plurality of data lines, and second light-emitting elements provided in the frame region, each of the second light-emitting elements being provided for each of the plurality of control lines, wherein electrical signals flowing through the plurality of control lines or electrical signals flowing through nodes provided in the control circuit are input to the second light-emitting elements.

It may be preferable that one of a cathode electrode or an anode electrode of the second light-emitting elements is electrically connected to a control line of the plurality of control lines or a node of the nodes, and the other of the cathode electrode or the anode electrode of the second light-emitting element is connected to a first constant voltage source.

Furthermore, it may be preferable that a transistor configured to turn on/off light emitting drive of the second light-emitting element is connected between the second light-emitting element and the control lines or the node.

Furthermore, it may be preferable that a control terminal of the transistor is connected to a control signal line configured to control the light emitting drive of the second light-emitting element.

It may be preferable that the display device further includes a transistor including a control terminal connected to the control line or the node, and a first conduction terminal connected to one of an anode electrode or a cathode electrode of a second light-emitting element of the second light-emitting elements, wherein the other of the anode electrode or the cathode electrode of the second light-emitting element is connected to a first constant voltage source, and a second conduction terminal of the transistor is connected to a second constant voltage source.

Furthermore, it may be preferable that the display device further includes a first transistor including a first control terminal connected to a control line of the plurality of control lines or a node of the nodes, and a second transistor including a second control terminal connected to a control signal line configured to control light emitting drive of a second light-emitting element of the second light-emitting elements, wherein a first conduction terminal of the second transistor is connected to a second conduction terminal of the first transistor, and a second conduction terminal of the second transistor is connected to one of an anode electrode or a cathode electrode of the second light-emitting element, and the other of the anode electrode or the cathode electrode of the second light-emitting element is connected to a first constant voltage source, and a first conduction terminal of the first transistor is connected to a second constant voltage source.

It may be preferable that the display device further includes a transistor including a control terminal connected to a control line of the plurality of control lines or a node of the nodes, wherein a first conduction terminal of the transistor is connected to an external power supply provided externally, and a second conduction terminal of the transistor is connected to one of an anode electrode or a cathode electrode of a second light-emitting element of the second light-emitting elements, and the other of the anode electrode or the cathode electrode of the second light-emitting element is connected to a first constant voltage source.

Furthermore, it may be preferable that the display device further includes a first transistor including a first control terminal connected to a control line of the plurality of control lines or a node of the nodes, and a second transistor including a second control terminal connected to a control signal line configured to control light emitting drive of a second light-emitting element of the second light-emitting elements, wherein a first conduction terminal of the second transistor is connected to a second conduction terminal of the first transistor, and a second conduction terminal of the second transistor is connected to one of an anode electrode or a cathode electrode of the second light-emitting element, and the other of the anode electrode or the cathode electrode of the second light-emitting element is connected to a first constant voltage source, and a first conduction terminal of the first transistor is connected to an external power supply provided externally.

Furthermore, it may be preferable that the second light-emitting elements are provided between the display region and the control circuit, a light-emitting layer in a first light-emitting element of the first light-emitting elements has an equal shape and an equal size with a light-emitting layer in a second light-emitting element of the second light-emitting elements, and an opening of an edge cover of the light-emitting layer in the first light-emitting element is greater than an opening of an edge cover of the light-emitting layer in the second light-emitting element.

Note that the "equal shape and equal size" mentioned above means that in a case where the luminescent material of the light-emitting layer is deposited in the display region and the frame region using masks having mask patterns of an equal shape and an equal size, the light-emitting layers of equal shape and equal size will be resultantly formed in the display region and the frame region. Accordingly, a light-emitting layer of the first light-emitting element and a light-emitting layer of the second light-emitting element do not necessarily have to have exactly equal shape and equal size.

It may preferable that a plurality of kinds of light-emitting elements emitting colors different from each other are used for a plurality of the second light-emitting elements respectively provided to the plurality of control lines.

Furthermore, it may be preferable that a plurality of the nodes are provided, and the plurality of kinds of light-emitting elements emitting colors different from each other are used for the plurality of the second light-emitting elements respectively provided to the plurality of the nodes.

Furthermore, it may be preferable that the plurality of control lines are scanning lines and emission lines, the control circuit is a scanning line drive circuit and an emission driver, and the plurality of kinds of light-emitting elements emitting colors different from each other are used for the plurality of the second light-emitting elements respectively provided to the scanning lines and the emission lines.

Furthermore, it may be preferable that the plurality of control lines are scanning lines, and the control circuit is a scanning line drive circuit.

Furthermore, it may be preferable that the plurality of control lines are emission lines, and the control circuit is an emission driver.

It may be preferable that the first light-emitting element and the second light-emitting element are organic EL elements. Note that the first light-emitting element and the second light-emitting element may be used not only in a case of constituting the organic EL element, but also in a case of constituting an inorganic light emitting diode or quantum dot light emitting diode.

Moreover, as a solution of the above problem, a manufacturing method for a display device according to the disclosure is a manufacturing method for a display device, the display device including a display region, a frame region provided around the display region, first light-emitting elements provided in the display region and displaying an image, a plurality of data lines to which data signals for displaying the image are supplied, a plurality of control lines arranged to intersect the plurality of data lines, a plurality of pixel circuits including the first light-emitting elements, each of the first light-emitting elements being provided at each of intersection points of the plurality of data lines and the plurality of control lines, a control circuit configured to activate the plurality of corresponding control lines at a timing at which the data signals are supplied to the plurality of data lines, and second light-emitting elements provided in the frame region, each of the second light-emitting elements being provided for each of the plurality of control lines, the manufacturing method including inspecting the control circuit by inputting, to the second light-emitting elements, electrical signals flowing through the plurality of control lines or electrical signals flowing through nodes provided in the control circuit, and detecting and evaluating light emission from the second light-emitting elements.

Further, it may be preferable that in inspecting the control circuit, performed is at least one of identifying a wiring line defective stage in the control circuit connected to the plurality of control lines, identifying a defective element in the control circuit, identifying an inter-wiring-line short in the control circuit, and identifying a wiring line open in the control circuit.

Further, it may be preferable that the second light-emitting elements and the first light-emitting elements are formed simultaneously.

Advantageous Effects of Disclosure

According to the disclosure, it is not necessary to bring the probe into direct contact with the control line or the node provided in the control circuit to be inspected, and an inspection device that enables inspection of a node in a non-contact manner can be realized. As a result, generation of damage to a metal wiring line constituting the control line or the node and a sealing resin covering a surface of the metal wiring line can be eliminated, and the occurrence of secondary defects associated with the inspection process by the contact probe can be prevented.

DESCRIPTION OF EMBODIMENTS

Hereinafter, embodiments according to the disclosure will be described in detail with reference to the drawings. Note that in the present specification and the drawings, constituent element having substantially the same functional configurations are designated by the same reference signs, and duplicated descriptions thereof are omitted.

Figure 1:
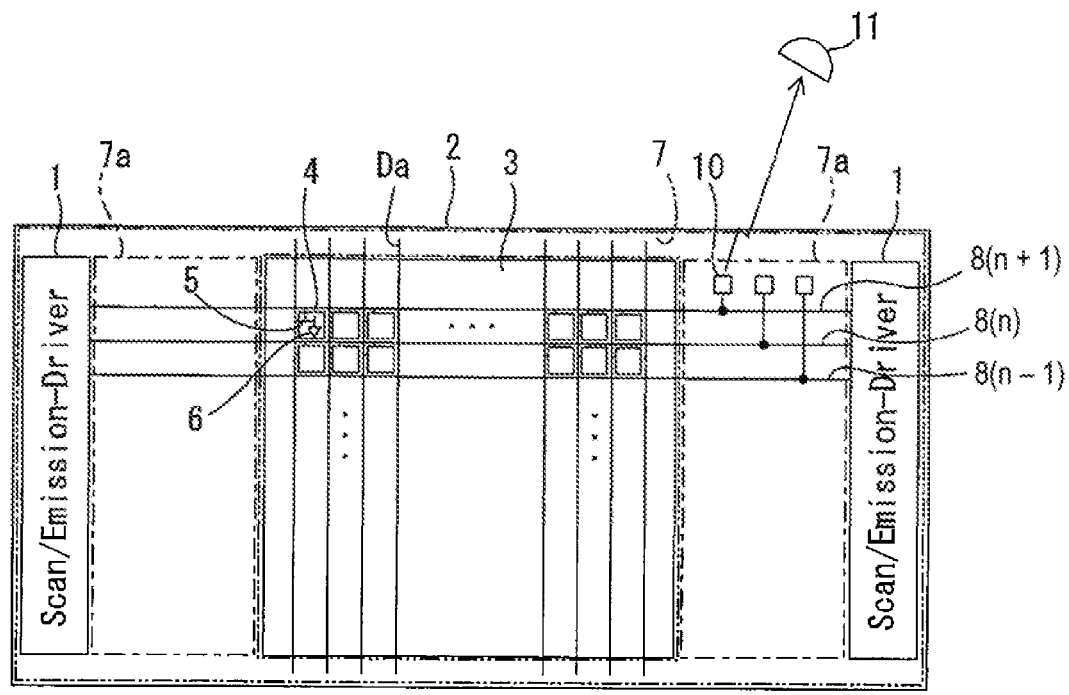
FIG. 1 is a schematic view of a display device 2 including a display region 3 and a control circuit 1 having an electrical control function for the display region 3, where first light-emitting elements 6 are arranged in a matrix shape in the display region 3, each of the first light-emitting elements 6 and each of pixel circuits 5 constituting each pixel 4.

FIG. 1 illustrates a schematic view of a display device 2 including a display region 3 in which a pixel 4 is constituted by a first light-emitting element 6 and a pixel circuit 5 at each of intersection points between a plurality of data lines Da disposed along a vertical direction and a plurality of control lines 8 arranged to intersect the data lines Da.

Further, the display device 2 is provided with a control circuit 1, connected to the control lines 8, on each of both left and right sides of a peripheral end portion of a frame region 7 provided around the display region 3. The display region 3 is a region on which image content is displayed. The frame region 7 provided outside the periphery of the display region 3 is not a region where the image content is displayed, but is a region that can be covered by a frame at the time when the display device 2 is formed into a manufactured article.

The control circuit 1 is provided with a control function to activate the corresponding control line 8 at the timing at which the data signal is supplied to the data line Da. The plurality of control lines 8 are disposed from the control circuit 1 toward the display region 3. In the present embodiment, as illustrated in FIG. 1, the control lines may be distinguished to be referred to as the control lines . . . $8(n-1)$, $8(n)$, and $8(n+1)$ from the bottom in the display device 2, or may be collectively referred to as the control line 8. Note that n represents an integer.

Figure 2:
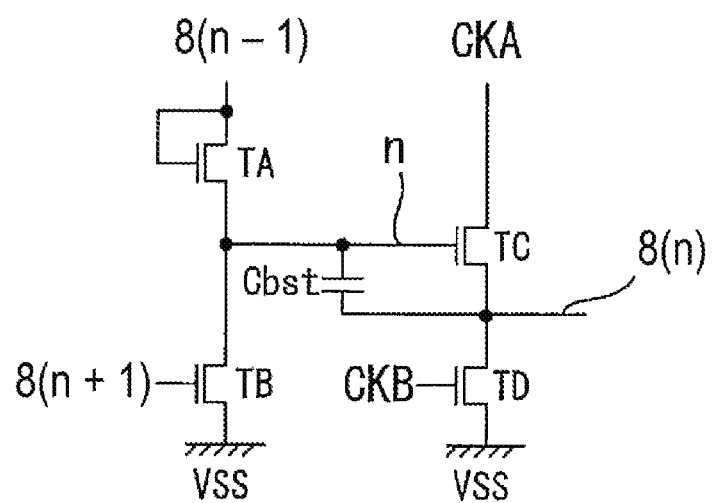
FIG. 2 illustrates a schematic of a circuit configuration in a case where a control circuit 1 is a scanning line circuit.

The control circuit 1 may be specifically either a scanning line drive circuit or an emission driver. The control line 8 functions as a scanning line in a case where the control circuit 1 is a scanning line drive circuit, and functions as an emission line in the case of the emission driver. FIG. 2 illustrates an example of a circuit configuration in the case where the control circuit 1 is a scanning line drive circuit.

The scanning line drive circuit illustrated in FIG. 2 holds a signal in a node n that is connected to a control terminal of a transistor TC and one end of a capacitance Cbst via a transistor TA turned on by the signal from the control line $8(n-1)$. The transistor TC is turned on by the signal held in the node n, and a first conduction terminal of the transistor TC receives an input of a clock signal CKA to activate the control line $8(n)$. Note that a transistor TD holds a potential of the control line $8(n)$. After that, the transistor TD is turned on by a clock signal CKB in an inverted relationship with the clock signal CKA, and discharges the charge of the control line $8(n)$ to a low potential power supply VSS. Furthermore, after a predetermined period of time elapses from when the control line $8(n)$ is activated, a transistor TB is turned on by a signal from the control line $8(n+1)$, and discharges the charge corresponding to the signal held in the node n to the low potential power supply VSS.

The control line 8 is introduced via the frame region 7 into the display region 3. In the frame region 7, an inspection circuit 10 provided with a second light-emitting element 9 is formed, the second light-emitting element 9 being connected to be capable of emitting a light by an electrical signal flowing through the control line 8 or the node provided in the control circuit 1 is input. In the present embodiment, the first light-emitting element 6 and the second light-emitting element 9 are organic EL elements.

The light emitted from the second light-emitting element 9 can be received by a light receiver 11 provided outside the display device 2. The light receiver 11 can present an intensity of the received light in graphical terms with respect to time, and can compare a relationship between the intensity and the electrical signal flowing through the control line 8 or the node provided in the control circuit 1. A photodiode may be used for a light receiving element of the light receiver 11.

Hereinafter, embodiments of display device 2 will be described.

First Embodiment

Configuration

Figure 3:
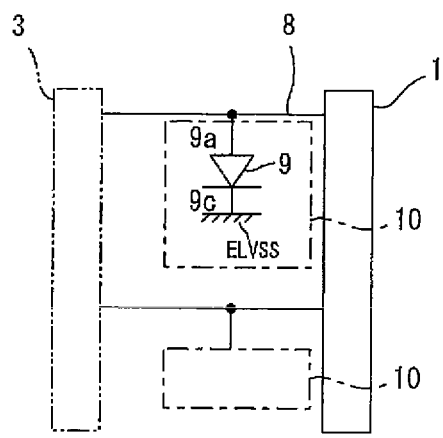
FIG. 3 illustrates a circuit configuration of an inspection circuit 10 according to a first embodiment.

FIG. 3 illustrates a circuit configuration of the inspection circuit 10 according to a first embodiment. Here, the inspection circuit 10 corresponds to each of portions surrounded by a dot-dash line in FIG. 3, and the same applies to the following embodiments. According to the first embodiment, the control line 8 is connected with an anode 9a of the second light-emitting element 9. A cathode 9c of the second light-emitting element 9 is connected to a cathode power supply ELVSS that is a first constant voltage source. According to the first embodiment, the second light-emitting element 9 can emit light by the current output from the control circuit 1.

Function

Figure 9:
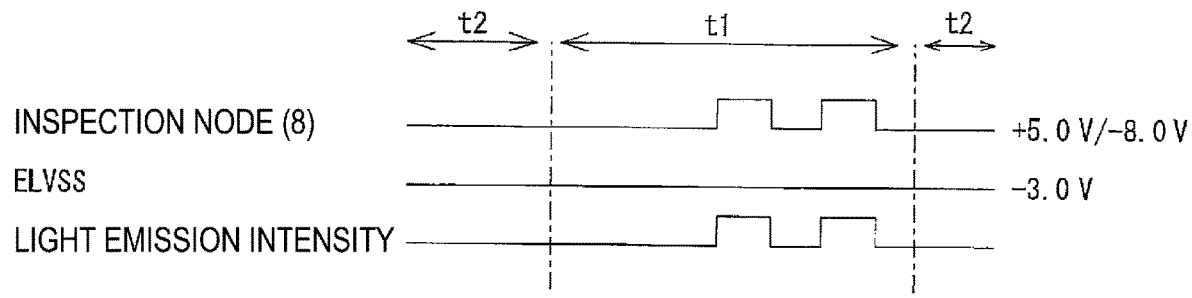
FIG. 9 illustrates a timing chart of the inspection circuit 10 according to the first embodiment.

FIG. 9 illustrates a timing chart of the inspection circuit 10 according to the first embodiment. In an inspection period t1, a voltage varying from −8.0 V to +5.0 V as illustrated in FIG. 9 is applied to the control line 8 at a predetermined timing. The cathode power supply ELVSS is fixed to −3.0 V. In this case, the control circuit 1 may be determined to be normally operating by the light receiver 11 detecting the light emitted from the second light-emitting element 9 at the timing when the voltage is applied to the control line 8. Note that in a non-inspection period t2, a voltage of −8.0 V is applied to the control line 8.

The inspection circuit 10 according to the first embodiment has the advantage that a circuit configuration is simple and the inspection circuit 10 can be formed in a small region.

Although FIG. 3 illustrates the example in which the electrical signal flowing through the control line 8, which is an output signal of the scanning line drive circuit 1, is input to the second light-emitting element 9, the embodiment is not limited thereto, and an electrical signal flowing through any node may be input. For example, a conduction terminal or control terminal of the transistor TB, a conduction terminal or control terminal of the transistor TD, or the like may be connected. A plurality of second light-emitting elements 9 may be provided and formed so that electrical signals of a plurality of nodes can be input. At this time, a color emitted for each node is changed, and thus which node is faulty can be found by observing the color, and therefore, the inspection can be easily made. In addition, the output signal of the scanning line drive circuit and the output signal of the emission driver are respectively input to the second light-emitting elements 9 emitting different colors, and thus whether or not the circuit is faulty is found by observing the colors, and therefore the inspection can be easily made.

Second Embodiment

Structure

Figure 4:
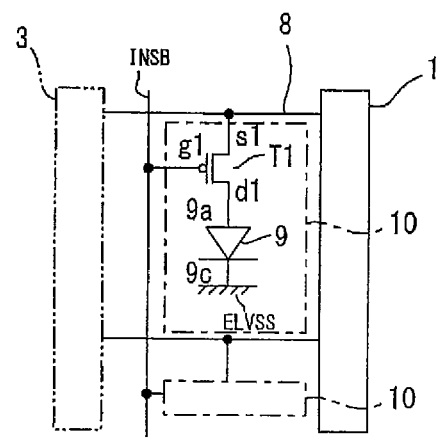
FIG. 4 illustrates a circuit configuration of an inspection circuit 10 according to a second embodiment.

FIG. 4 illustrates a circuit configuration of an inspection circuit 10 according to a second embodiment. According to the second embodiment, a first conduction terminal s1 of a PMOS transistor T1 is connected to the control line 8, and an anode 9a of the second light-emitting element 9 is connected to a second conduction terminal d1 of the transistor T1. A control signal line INSB is connected to a control terminal g1 of the transistor T1. A cathode 9c of the second light-emitting element 9 is connected to a cathode power supply ELVSS. According to the second embodiment, in a state where the transistor T1 is turned on, a current output from the control circuit 1 can be flown through the second light-emitting element 9 to emit light.

Function

Figure 10:
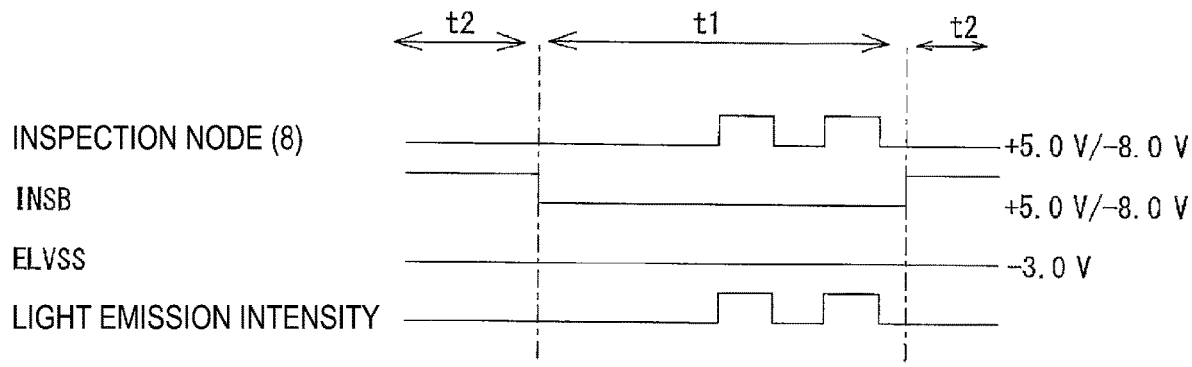
FIG. 10 illustrates a timing chart of the inspection circuit 10 according to the second embodiment.

FIG. 10 illustrates a timing chart of the inspection circuit 10 according to the second embodiment. In the inspection period t1, an electric potential of the control signal line INSB is changed from +5.0 V to −8.0 V, and the voltage changing from −8.0 V to +5.0 V as illustrated in FIG. 10 is applied to the control line 8 at a predetermined timing. The cathode power supply ELVSS is fixed to −3.0 V. In this case, the control circuit 1 may be determined to be normally operating by the light receiver 11 detecting the light emitted from the second light-emitting element 9 at the timing when the voltage is applied to the control line 8.

The inspection circuit 10 according to the second embodiment can select the inspection period t1 by turning on the transistor T1. Furthermore, in a non-inspection period t2, the current from the control line 8 to the second light-emitting element 9 can be blocked by turning off the transistor T1, and thus, potential fluctuations in the control line 8 can be prevented.

Third Embodiment

Structure

Figure 5:
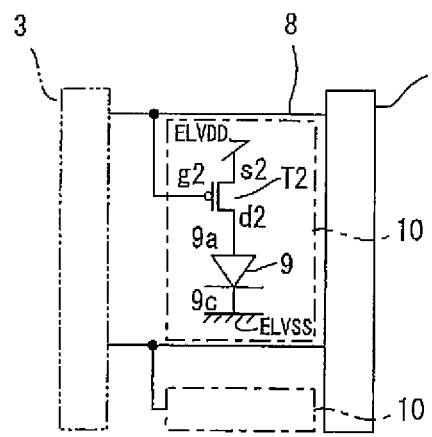
FIG. 5 illustrates a circuit configuration of an inspection circuit 10 according to a third embodiment.

FIG. 5 illustrates a circuit configuration of an inspection circuit 10 according to a third embodiment. According to the third embodiment, a control terminal g2 of a PMOS transistor T2 is connected to the control line 8. A drive power supply ELVDD, which is a second constant voltage source for driving the pixels 4 in the display region 3, is connected to a first conduction terminal s2 of the transistor T2. The anode 9a of the second light-emitting element 9 is connected to a second conduction terminal d2 of the transistor T2. The cathode 9c of the second light-emitting element 9 is connected to the cathode power supply ELVSS. According to the third embodiment, in a state where the transistor T2 is turned on, a current output from the control circuit 1 can be flown through the second light-emitting element 9 to emit light. Here, the drive power supply ELVDD is a power supply independent of the power supply that supplies power to the control line 8.

According to the third embodiment, the current supply is continuously performed at least in the inspection period t1 from the drive power supply ELVDD, and the transistor T2 is turned on by the voltage output from the control circuit 1, thereby, the current from the drive power supply ELVDD can be flown through the second light-emitting element 9 to emit light.

Function

Figure 11:
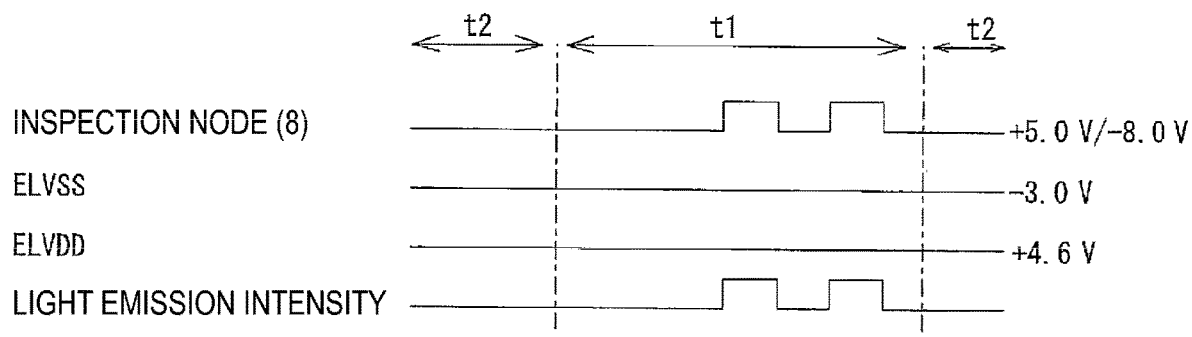
FIG. 11 illustrates a timing chart of the inspection circuit 10 according to the third embodiment.

FIG. 11 illustrates a timing chart of the inspection circuit 10 according to the third embodiment. The voltage of the drive power supply ELVDD is maintained at +4.6 V and the voltage of the cathode power supply ELVSS is maintained at −3.0 V for the non-inspection period t2 and the inspection period t1. Then, in the inspection period t1, a voltage changing from −8.0 V to +5.0 V as illustrated in FIG. 11 is applied to the control line 8 at a predetermined timing. In this case, the control circuit 1 may be determined to be normally operating by the light receiver 11 detecting the light emitted from the second light-emitting element 9 at the timing when the voltage is applied to the control line 8. Furthermore, in the non-inspection period t2, the current from the drive power supply ELVDD to the second light-emitting element 9 can be blocked by turning off the transistor T2.

According to the third embodiment, there is an advantage that voltage drop of the control line 8 caused by the light emission of the second light-emitting element 9 in the inspection period t1 is not generated. Also, by using the drive power supply ELVDD as a power supply source, the circuit configuration can be simplified compared to a case of providing an independent power supply source.

Fourth Embodiment

Structure

Figure 6:
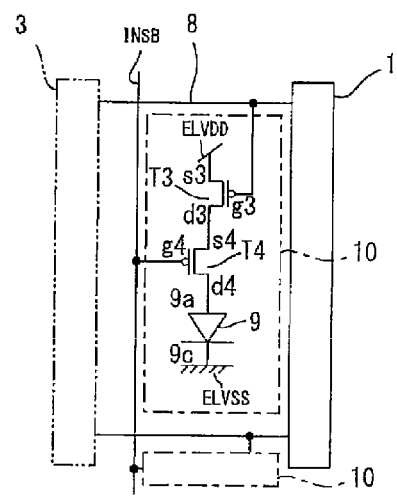
FIG. 6 illustrates a circuit configuration of an inspection circuit 10 according to a fourth embodiment.

FIG. 6 illustrates a circuit configuration of an inspection circuit 10 according to a fourth embodiment.

According to the fourth embodiment, a control terminal g3 of a PMOS first transistor T3 is connected to the control line 8, and the drive power supply ELVDD power supply for driving the pixels 4 in the display region 3 is connected to a first conduction terminal s3 of the first transistor T3. A first conduction terminal s4 of a PMOS second transistor T4 is connected to a second conduction terminal d3 of the first transistor T3, and the anode 9a of the second light-emitting element 9 is connected to a second conduction terminal d4 of the second transistor T4. The control signal line INSB is connected to a control terminal g4 of the second transistor T4. The cathode 9c of the second light-emitting element 9 is connected to the cathode power supply ELVSS. According to a fifth embodiment, in a state where the second transistor T4 is turned on, the current supply is continuously performed at least in the inspection period t1 from the drive power supply ELVDD, and the first transistor T3 is turned on by the voltage output from the control circuit 1, thereby, the current from the drive power supply ELVDD can be flown through the second light-emitting element 9 to emit light.

Function

Figure 12:
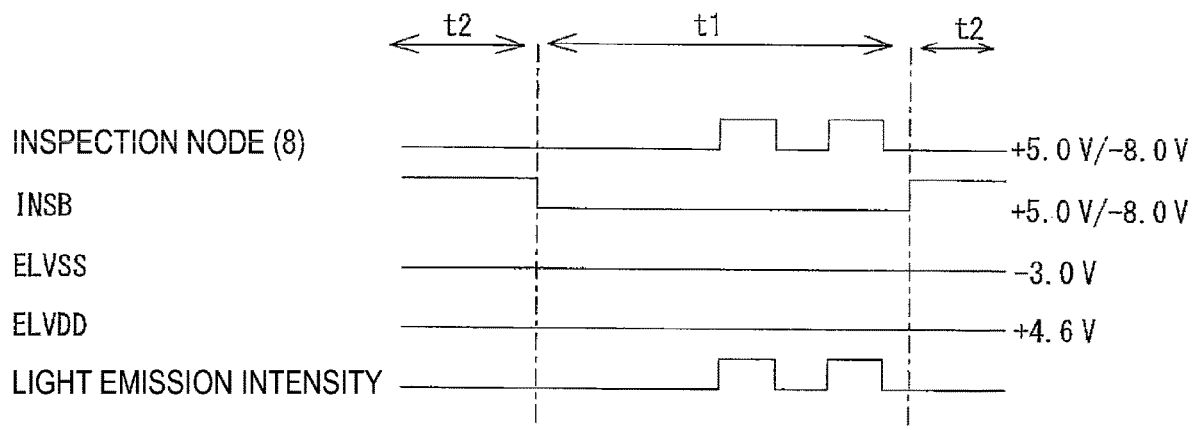
FIG. 12 illustrates a timing chart of the inspection circuit 10 according to the fourth embodiment.

FIG. 12 illustrates a timing chart of the inspection circuit 10 according to the fourth embodiment. The voltage of the drive power supply ELVDD is maintained at +4.6 V and the voltage of the cathode power supply ELVSS is maintained at −3.0 V for the non-inspection period t2 and the inspection period t1. In the inspection period t1, an electric potential of the control signal line INSB is changed from +5.0 V to −8.0 V, and the voltage changing from −8.0 V to +5.0 V as illustrated in FIG. 12 is applied to the control line 8 at a predetermined timing. In this case, the control circuit 1 may be determined to be normally operating by the light receiver 11 detecting the light emitted from the second light-emitting element 9 at the timing when the voltage is applied to the control line 8. Furthermore, in the non-inspection period t2, the current from the drive power supply ELVDD to the second light-emitting element 9 can be reliably blocked by maintaining the potential of the control signal line INSB at a high potential and turning off the transistor T4.

The inspection circuit 10 according to the fourth embodiment can select the inspection period t1 by turning on the transistor T4.

Furthermore, there is an advantage that voltage drop of the control line 8 caused by the light emission of the second light-emitting element 9 in the inspection period t1 is not generated. Also, by using the drive power supply ELVDD as a power supply source, the circuit configuration can be simplified compared to a case of providing an independent power supply source.

Fifth Embodiment

Structure

Figure 7:
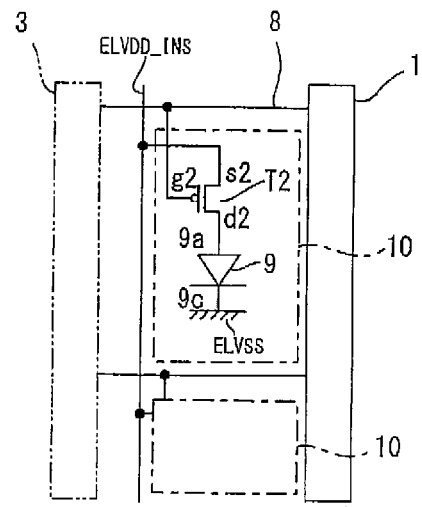
FIG. 7 illustrates a circuit configuration of an inspection circuit 10 according to a fifth embodiment.

FIG. 7 illustrates a circuit configuration of an inspection circuit 10 according to a fifth embodiment.

In the fourth embodiment, a power supply connected to the first conduction terminal s2 of the PMOS transistor T2 is an external power supply ELVDD_INS that is independent of the drive power supply ELVDD for driving the pixels 4 in the display region 3. The other portions of the circuit configuration are the same as the third embodiment.

Function

Figure 13:
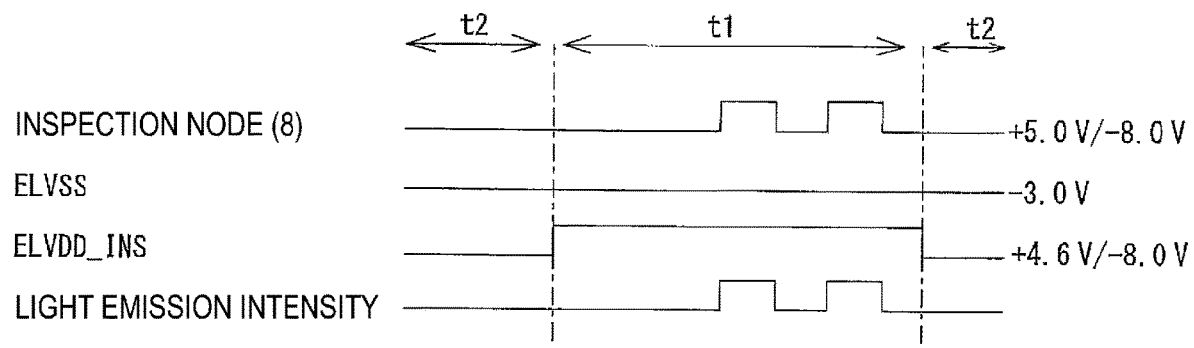
FIG. 13 illustrates a timing chart of the inspection circuit 10 according to the fifth embodiment.

FIG. 13 illustrates a timing chart of the inspection circuit 10 according to the fifth embodiment. In the inspection period t1, a voltage of the external power supply ELVDD_INS is changed from −8.0 V to +4.6 V. The voltage of the cathode power supply ELVSS is maintained at −8.0 V in the inspection period t1. Then, in the inspection period t1, a voltage changing from −8.0 V to +5.0 V as illustrated in FIG. 13 is applied to the control line 8 at a predetermined timing. In this case, the control circuit 1 may be determined to be normally operating by the light receiver 11 detecting the light emitted from the second light-emitting element 9 at the timing when the voltage is applied to the control line 8. Furthermore, in the non-inspection period t2, the current from the external power supply ELVDD_INS to the second light-emitting element 9 can be blocked by turning off the transistor T2.

According to the fifth embodiment, variations in the drive power supply ELVDD due to an unintentional flow of current into the inspection circuit 10 can be prevented. This can eliminate the possibility of variation occurring in the intensity of the light emission from the pixels 4 in the display region 3 due to an unintentional variation in the drive power supply ELVDD.

In addition, the application of the voltage from the external power supply ELVDD_INS only for the inspection period independently from the drive power supply ELVDD can prevent unwanted light emission of the second light-emitting element 9 due to an off leak from the transistor T2.

Sixth Embodiment

Structure

Figure 8:
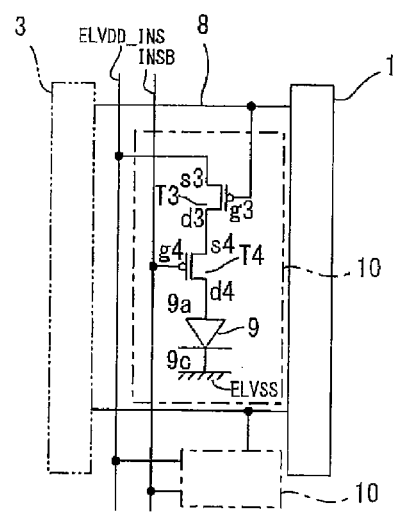
FIG. 8 illustrates a circuit configuration of an inspection circuit 10 according to a sixth embodiment.

FIG. 8 illustrates a circuit configuration of an inspection circuit 10 according to a sixth embodiment.

In the sixth embodiment, a power supply connected to the first conduction terminal s3 of the first transistor T3 is an external power supply ELVDD_INS that is independent of the drive power supply ELVDD for driving the pixels 4 in the display region 3. The other portions of the circuit configuration are the same as the fourth embodiment.

Function

Figure 14:
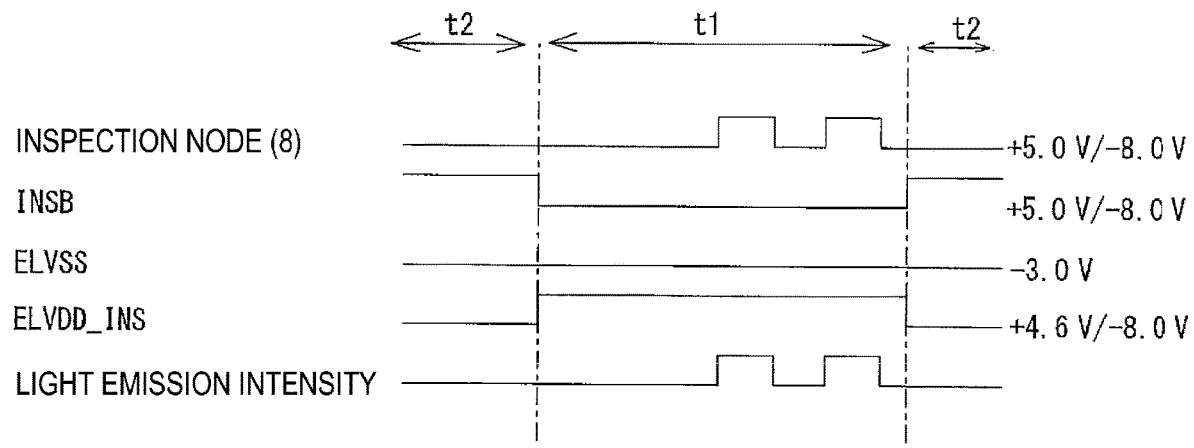
FIG. 14 illustrates a timing chart of the inspection circuit 10 according to the sixth embodiment.

FIG. 14 illustrates a timing chart of the inspection circuit 10 according to the sixth embodiment. In the inspection period t1, a voltage of the external power supply ELVDD_INS is changed from −8.0 V to +4.6 V. The voltage of the cathode power supply ELVSS is maintained at −8.0 V in the inspection period t1. Furthermore, in the inspection period t1, an electric potential of the control signal line INSB is changed from +5.0 V to −8.0 V, and the voltage changing from −8.0 V to +5.0 V as illustrated in FIG. 14 is applied to the control line 8 at a predetermined timing. In this case, the control circuit 1 may be determined to be normally operating by the light receiver 11 detecting the light emitted from the second light-emitting element 9 at the timing when the voltage is applied to the control line 8. In the non-inspection period t2, the current from the external power supply ELVDD_INS to the second light-emitting element 9 can be reliably blocked by maintaining the potential of the control signal line INSB at a high potential and turning off the transistor T4.

According to the sixth embodiment, the inspection period t1 can be selected by turning on the second transistor T4. Furthermore, there is an advantage that voltage drop of the control line 8 caused by the light emission of the second light-emitting element 9 in the inspection period t1 is not generated. In addition, the application of the voltage from the external power supply ELVDD_INS only for the inspection period independently from the drive power supply ELVDD can prevent unwanted light emission of the second light-emitting element 9 due to an off leak from the second transistor T4.

In the first embodiment to the sixth embodiment described above, a PMOS transistor is used for the transistor for driving the second light-emitting element 9, but an NMOS transistor may be used instead of a PMOS transistor by adjusting a control terminal voltage for each transistor to serve as that for driving the NMOS transistor.

Structure of Second Light-Emitting Element 9

The second light-emitting element 9 can be formed and disposed in the frame region 7 clearly separate from the first light-emitting element formed in the display region 3. In forming the display region 3 constituted by the pixels 4 including the first light-emitting elements, light-emitting elements included in dummy pixels formed slightly outside an outer edge of the display region 3 may be used as the second light-emitting elements. In other words, the first light-emitting element and the second light-emitting element are formed simultaneously.

Figure 15:
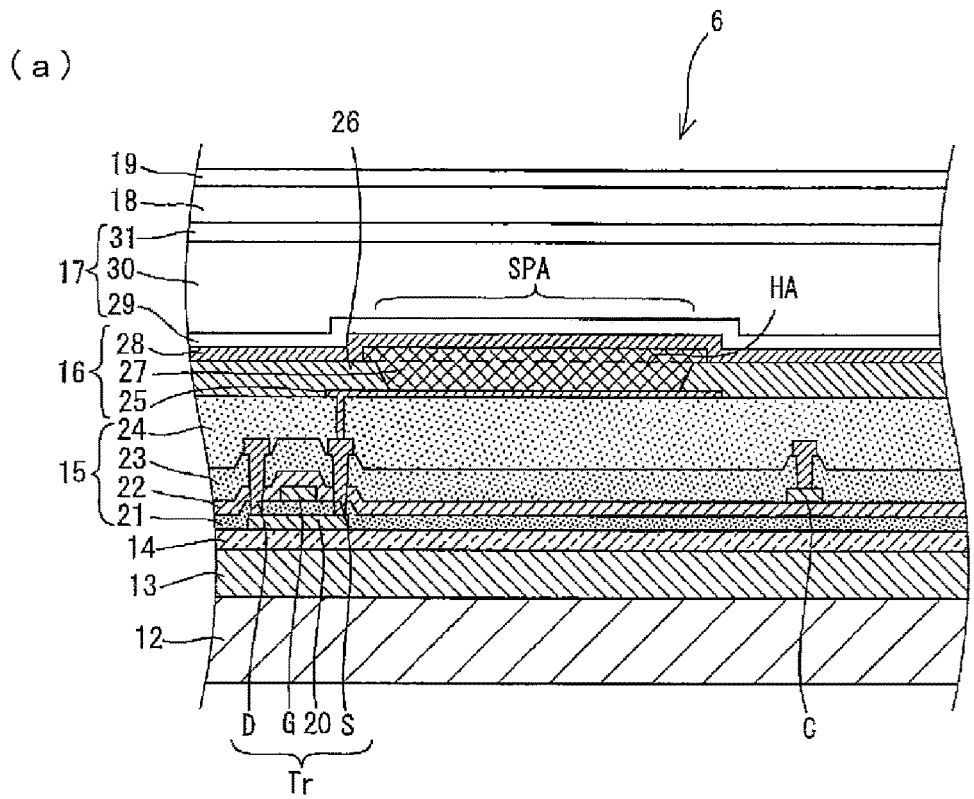
FIG. 15(a) illustrates a cross-section example around the first light-emitting element 6.
FIG. 15(b) illustrates a cross-section example around a second light-emitting element 9.
Figure 15:
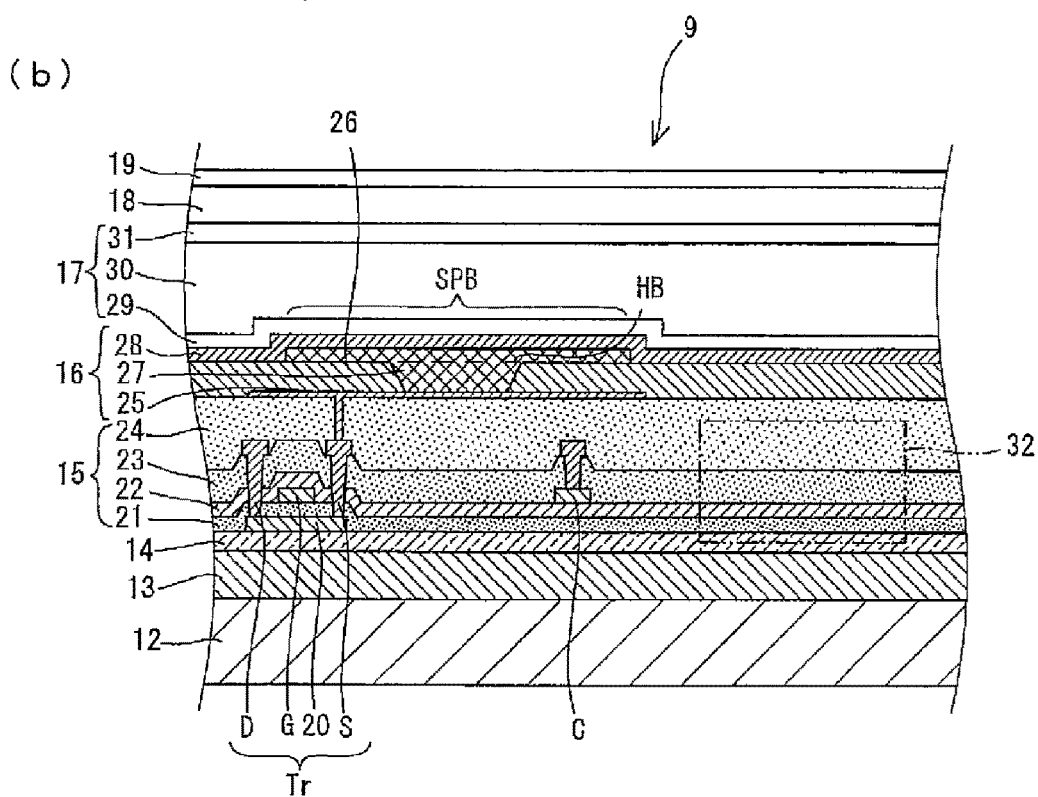

(a) of FIG. 15 illustrates a cross-section example around a subpixel SPA indicating one luminescent color of the first light-emitting element 6, and (b) of FIG. 15 illustrates a cross-section example around a subpixel SPB indicating one luminescent color of the second light-emitting element 9.

Each of the light-emitting elements illustrated in FIGS. 15(a) and 15(b) is a top-emitting type that emits light upward, and includes, in sequence from the bottom side, a base material 12, a resin layer 13, a barrier layer 14 (base coat layer), a TFT layer 15, a light-emitting element layer 16, a sealing layer 17, an adhesive layer 18, and a function film 19.

The TFT layer 15 includes a semiconductor film 20, an inorganic insulating film 21 formed in a layer above the semiconductor film 20, a gate electrode G formed in a layer above the inorganic insulating film 21, an inorganic insulating film 22 formed in a layer above the gate electrode G, a capacitance electrode C formed in a layer above the inorganic insulating film 22, an inorganic insulating film 23 formed in a layer above the capacitance electrode C, a source electrode S and a drain electrode D both formed in a layer above the inorganic insulating film 23, and a flattening film 24 formed in a layer above the source electrode S and the drain electrode D.

A thin film transistor Tr (light emission control transistor) is configured to include the semiconductor film 20, the inorganic insulating film 21 (gate insulating film), and the gate electrode G. The source electrode S is connected to a source region of the semiconductor film 20, and the drain electrode D is connected to a drain region of the semiconductor film 20.

The semiconductor film 20 is formed of low-temperature polysilicon (LTPS) or an oxide semiconductor, for example. In FIG. 15, the TFT is illustrated as having a top gate structure in which the semiconductor film 20 is the channel.

The light-emitting element layer 16 is an organic light-emitting diode layer in the present embodiment, and includes an anode electrode 25 formed in a layer above the flattening film 24, an edge cover 26 that is a flattening film defining the subpixel SPA or SPB in an active area (a region overlapping the light-emitting element layer 16), a light-emitting layer 27 formed in a layer above the anode electrode 25, and a cathode electrode 28 formed in a layer above the light-emitting layer 27. An organic light-emitting diode (OLED) is configured to include the anode electrode 25, the light-emitting layer 27, and the cathode electrode 28.

The edge cover 26 surrounds the end portions of the anode electrode 25. The light-emitting layer 27 is formed in a region surrounded by the edge cover 26, using vapor deposition or an ink-jet method.

An anode electrode 25 is light-reflective and is formed by layering, for example, Indium Tin Oxide (ITO) and an alloy containing Ag. The cathode electrode 28 can be fabricated from a transparent conductive material such as ITO or Indium Zinc Oxide (IZO).

Since the cathode electrode 28 is transparent and the anode electrode 25 is light-reflective, the light emitted from the light-emitting layer 27 travels upwards and results in top emission.

The sealing layer 17 is transparent, and includes an inorganic sealing film 29 covering the cathode electrode 28, an organic sealing film 30 formed in a layer above the inorganic sealing film 29, and an organic sealing film 31 covering the organic sealing film 30. The sealing layer 17 covers the light-emitting element layer 16, and inhibits foreign matters such as water and oxygen from infiltrating the light-emitting element layer 16. The function film 19 has an optical compensation function, a touch sensor function, a protection function, or the like, for example.

Example of Structures of Subpixels SPA and SPB

Figure 16:
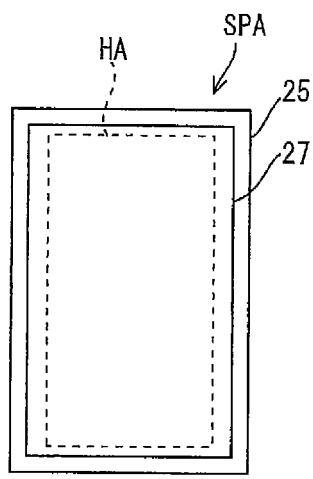
FIG. 16 illustrates a plan view (a) of the first light-emitting element 6 and a plan view (b) of the second light-emitting element 9.
Figure 16:
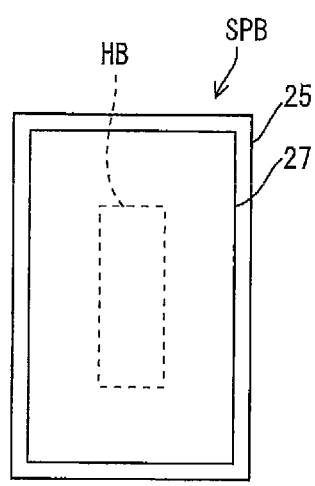

FIG. 16 is a plan view illustrating an example of structures of the subpixels SPA and SPB. As illustrated in (a) of FIG. 15 and (a) of FIG. 16, the subpixel SPA includes at least the edge cover 26 having an opening HA, and the light-emitting layer 27 disposed in a layer above the edge cover 26. In the subpixel SPA, the edge cover 26 surrounds the entire periphery of the opening HA. The light-emitting layer 27 is formed completely occupying at least the opening HA. A surface area of the light-emitting layer 27 is greater than a surface area of the opening HA. Of the light-emitting layer 27, a range that overlaps the opening HA contributes to light emission of the first light-emitting element 6.

As illustrated in (b) of FIG. 15 and (b) of FIG. 16, the subpixel SPB includes at least the edge cover 26 having an opening HB, and the light-emitting layer 27 disposed in a layer above the edge cover 26 and having an equal shape and equal size with the light-emitting layer 27 in the subpixel SPA. In the subpixel SPB, the edge cover 26 surrounds the entire periphery of the opening HB. The light-emitting layer 27 is formed completely occupying at least the opening HB. A surface area of the light-emitting layer 27 is greater than a surface area of the opening HB. Of the light-emitting layer 27, a range that overlaps the opening HB contributes to light emission of the second light-emitting element 9. In this way, the opening HA of the edge cover 26 of the light-emitting layer 27 in the first light-emitting element 6 is larger than the opening HB of the edge cover 26 of the light-emitting layer 27 in the second light-emitting element 9. As a result, even in a case where a vapor deposition misalignment occurs in the light-emitting layer 27 in the second light-emitting element 9 that is deposited near an end of a vapor deposition mask, the light-emitting layer 27 can be formed to cover the opening HB of the edge cover 26 by making smaller the opening HB of the edge cover 26 of the light-emitting layer 27 in the second light-emitting element 9, and the light can be reliably emitted in the desired light-emitting region.

Note that in addition to the above description, for example, in a case where the second light-emitting element 9 is formed in a portion on the central side rather than near the end of the vapor deposition mask, or the second light-emitting element 9 is formed using a vapor deposition mask separate from the first light-emitting element 6, a light emitting area of the first light-emitting element 6 and a light emitting area of the second light-emitting element 9 may be the same size.

The "equal shape and equal size" mentioned above means that in a case where the luminescent material of the light-emitting layer 27 is deposited in the display region 3 and a peripheral region of the display region 3 using masks having mask patterns of an equal shape and an equal size, the light-emitting layers 27 of equal shape and equal size will be resultantly formed in the display region 3 and the peripheral region (hereinafter, referred to as the dummy region) of the display region 3. Therefore, for using the vapor deposition technique, even in a case where using a mask having a mask pattern of the equal size, the light-emitting layer 27 of the subpixel SPA and the light-emitting layer 27 of the subpixel SPB are not necessarily completely formed in the equal shape and the equal size in some cases.

Note that a dummy region 7a is formed using a single mask in a case of forming the display region 3, but is formed slightly outside the region where the image content is displayed as indicated by a dot-dash line in FIG. 1, and therefore, belongs to the frame region 7 in the disclosure. The pixels formed in the dummy region 7a are referred to as dummy pixels. The light-emitting element constituting the dummy pixels may be formed simultaneously with the first light-emitting element 6, and may be the second light-emitting element 9.

As illustrated in FIG. 16, the opening HA, which is provided on the inner side of the anode electrode 25 formed in the display region 3, is larger than the opening HB, which is provided on the inner side of the anode electrode 25 formed in the dummy region 7a. Furthermore, the light-emitting layer 27 formed in the display region 3 has an equal shape and equal size with the light-emitting layer 27 formed in the dummy region 7a.

The opening HB is smaller than the opening HA, and thus, even in a case where there is a lower precision in a deposition pattern used in a case of depositing the luminescent material in the dummy region 7a, the light-emitting layer 27 is formed so as to completely cover the opening HB in the dummy region 7a. Accordingly, the subpixel SPB correctly functioning can be formed in the dummy region 7a.

To ensure sufficient light emission from the light-emitting layer 27, a contact hole cannot be provided in the display region 3 so as to overlap a part of the light-emitting layer 27 occupied by the opening HA. Thus, as illustrated in (a) of FIG. 15, in the display region 3, a contact hole of the thin film transistor Tr is formed at a position not overlapping the opening HA. Likewise, a contact hole of the capacitance electrode C is formed at a position not overlapping the opening HA.

In the dummy region 7a, a portion of the light-emitting layer 27 that does not overlap the opening HB does not function as an effective light-emitting layer 27. Thus, as illustrated in (b) of FIG. 15, in the dummy region 7a, a contact holes of the thin film transistor Tr can be formed at a portion of the light-emitting layer 27 that does not overlap the opening HB (a portion that overlaps the opening HA in the display region 3). Likewise, a contact hole of the capacitance electrode C can be formed at a portion of the light-emitting layer 27 that does not overlap the opening HB. This allows, in the dummy region 7a, both the thin film transistor Tr and the capacitance electrode C to be provided closer to the opening HB. In this way, since the light-emitting element constituting the dummy pixel is used for the second light-emitting element 9 and the inspection circuit 10 is provided in the dummy region 7a, a special space is not required to form the second light-emitting element 9 and the inspection circuit 10, and frame narrowing of the display device 2 can be easily performed. Note that a region 32 may be used as another circuit arrangement space.

The plurality of second light-emitting elements 9 respectively provided to the plurality of control lines $8(n-1)$, $8(n)$, $8(n+1)$, . . . may be formed as a plurality of kinds of light-emitting elements emitting colors different from each other.

Defect Detection Example of Node in Control Line or Control Circuit

Detection Example 1

Figure 17:
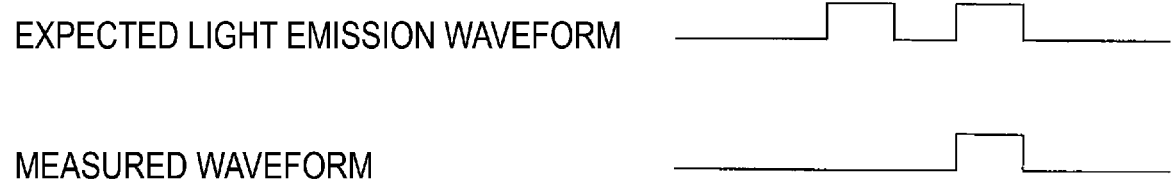
FIG. 17 illustrates an expected waveform (upper row) and a measured waveform (lower row) obtained from the second light-emitting element 9 of the inspection circuit 10 in Detection Example 1.

According to the disclosure, in a case where a potential of an internal node n in FIG. 2, for example, is be measured as an output of the control circuit 1 or an internal node of the control circuit 1, and a waveform is obtained that is different from a the light emission waveform expected based on the signal input from the control line 8 to the second light-emitting element 9, an abnormality of the control line 8 can be detected. For example, a method can be taken in which a signal is input twice to the control line 8 to cause the second light-emitting element 9 to emit light twice, and, whether or not the second light-emitting element 9 correctly emits light twice is detected. As illustrated in FIG. 17, the abnormality of the control line 8 or the internal node of the control circuit 1 can be detected in such a case where there is no first time signal change in contrast to the expected light emission waveform.

As another example, there is a method in which the second light-emitting elements including upper and lower rows, that is, three second light-emitting elements are made to simultaneously emit light to detect abnormalities in the control line 8 or the internal node of the control circuit 1 based on whether or not the light is emitted. In a case where the signal is simultaneously input to the control lines $8(n-1)$, $8(n)$, and $8(n+1)$ illustrated in FIG. 1, the same light emission waveform caused by the light emission is obtained from the second light-emitting elements 9 associated with the control lines $8(n+1)$ and $8(n-1)$, whereas in a case where no light emission waveform is obtained from the control line $8(n)$, an abnormality of the control line $8(n)$ can be detected.

Detection Example 2

Figure 18:
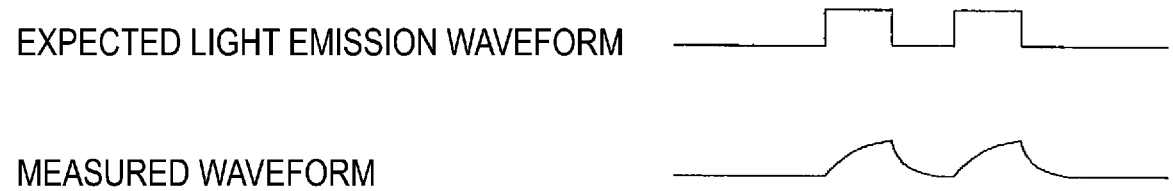
FIG. 18 illustrates an expected waveform (upper row) and a measured waveform (lower row) obtained from the second light-emitting element 9 of the inspection circuit 10 in Detection Example 2.

In a case where a defective element such as an abnormal resistance or an abnormal TFT is present on the control line 8 closer to the control circuit 1 side than a portion connected to the inspection circuit 10, a defect can be detected by a waveform rounding being output in a light emission signal as illustrated in the lower row of FIG. 18 in contrast to the expected light emission waveform illustrated in the upper row of FIG. 18.

Detection Example 3

Figure 19:
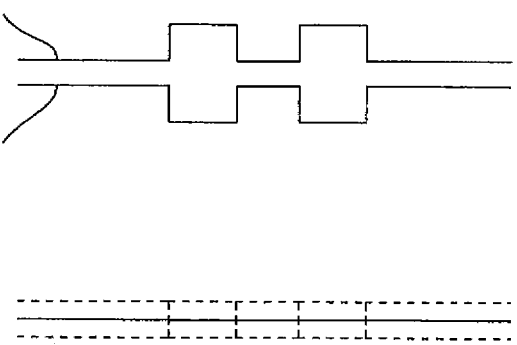
FIG. 19 illustrates an expected waveform (a set of waveforms in upper row) and a measured waveform (lower row) obtained from the second light-emitting element 9 of the inspection circuit 10 in Detection Example 3.

In a case where the control line $8(n)$ and the control line $8(n-1)$ adjacent to each other are short due to some cause, for example, in a case where opposite phase signals are simultaneously applied to the control line $8(n)$ and the control line $8(n-1)$, signals of both control lines cancel out each other (dashed lines illustrated in the lower row of FIG. 19). In this case, an abnormal waveform is obtained in which no light emission is seen as illustrated in the lower row of FIG. 19, in contrast to the expected light emission waveform illustrated in the upper row of FIG. 19.

Detection Example 4

Figure 20:
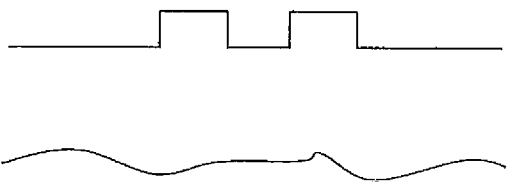
FIG. 20 illustrates an expected waveform (upper row) and a measured waveform (lower row) obtained from the second light-emitting element 9 of the inspection circuit 10 in Detection Example 4.

In a case where the control line 8 or the node of interest is open, and the intensity of the light emission from the second light-emitting element 9 provided at a position farther from the control circuit 1 than the open position is measured, the measured waveform is indefinite or a waveform that does not match the expected light emission waveform is detected as illustrated in the lower row of FIG. 20, in contrast to the expected light emission waveform illustrated in the upper row of FIG. 20.

Note that providing the second light-emitting element 9 for each control line 8 means that the second light-emitting element 9 may be provided to all of the control lines 8, or may be provided for each of some control lines 8 among the plurality of control lines 8. For example, the second light-emitting element 9 may be provided for every two or every three control lines 8.

Manufacturing Method for Display Device 2

A manufacturing method for the display device 2 can be realized that includes an inspection process of inspecting the control circuit 1 by inputting, to the second light-emitting element 9, an electrical signal flowing through the control line 8 or an electrical signal flowing through the node n or the like provided in the control circuit 1, and detecting and evaluating light emission from the second light-emitting element 9.

According to this manufacturing method, a defect of the scanning line drive circuit or emission driver can be detected after a process of vapor-depositing a material constituting the light-emitting element and before a process of inkjet thin film encapsulation (TFE), for example, and thus, it is possible to enable a driver failure to be sorted at a stage earlier than an inspection time for the known panel.

In particular, in the manufacturing method for display device, preferably performed is at least one of identifying a wiring line defective stage in the control circuit 1 connected to the control line 8 based on Detection Example 1, identifying a defective element in the control circuit 1 based on Detection Example 2, identifying an inter-wiring-line short in the control circuit 1 based on Detection Example 3, and identifying a wiring line open in the control circuit based on Detection Example 4. This allows defect factors described in Detection Examples 1 to 4 to be made definite earlier than in the known art to manufacture the display device 2.

The display according to the present embodiment is not particularly limited as long as it is a display panel including a display element. The display element is a display element of which luminance and transmittance are controlled by an electric current, and examples of the electric current-controlled display element include an organic Electro Luminescence (EL) display provided with an Organic Light Emitting Diode (OLED), an EL display such as an inorganic EL display provided with an inorganic light emitting diode, and a QLED display provided with a Quantum dot Light Emitting Diode (QLED).

The invention claimed is:

1. A display device including a display region and a frame region provided around the display region and configured to display an image by causing first light-emitting elements provided in the display region to emit light, the display device comprising:
   a plurality of data lines to which data signals for displaying the image are supplied;
   a plurality of control lines arranged to intersect the plurality of data lines;
   a plurality of pixel circuits including the first light-emitting elements, each of the first light-emitting elements being provided at each of intersection points of the plurality of data lines and the plurality of control lines;
   a control circuit configured to activate the plurality of corresponding control lines at a timing at which the data signals are supplied to the plurality of data lines; and
   second light-emitting elements provided in the frame region, each of the second light-emitting elements being provided for each of the plurality of control lines,
   wherein electrical signals flowing through the plurality of control lines or electrical signals flowing through nodes provided in the control circuit are input to the second light-emitting elements,
   wherein one of a cathode electrode or an anode electrode of one of the second light-emitting elements is electrically connected to one of the plurality of control lines or one of the nodes, and the other of the cathode electrode or the anode electrode of the second light-emitting element is connected to a first constant voltage source, and
   wherein a transistor configured to turn on or off light emitting drive of the second light-emitting element is connected between the second light-emitting element and the control lines or the node.

2. The display device according to claim 1,
wherein a control terminal of the transistor is connected to a control signal line configured to control the light emitting drive of the second light-emitting element.

3. The display device according to claim 1,
wherein the second light-emitting elements are provided between the display region and the control circuit, a light-emitting layer in a first light-emitting element of the first light-emitting elements has an equal shape and an equal size with a light-emitting layer in a second light-emitting element of the second light-emitting elements, and an opening of an edge cover of the light-emitting layer in the first light-emitting element is greater than an opening of an edge cover of the light-emitting layer in the second light-emitting element.

4. The display device according to claim 1,
wherein a plurality of kinds of light-emitting elements emitting colors different from each other are used for a plurality of the second light-emitting elements respectively provided to the plurality of control lines.

5. The display device according to claim 4,
wherein a plurality of the nodes are provided, and the plurality of kinds of light-emitting elements emitting colors different from each other are used for the plurality of the second light-emitting elements respectively provided to the plurality of the nodes.

6. The display device according to claim 4,
wherein the plurality of control lines are scanning lines and emission lines, the control circuit is a scanning line drive circuit and an emission driver, and the plurality of kinds of light-emitting elements emitting colors different from each other are used for the plurality of the second light-emitting elements respectively provided to the scanning lines and the emission lines.

7. The display device according to claim 1,
wherein the plurality of control lines are scanning lines, and the control circuit is a scanning line drive circuit.

8. The display device according to claim 1,
wherein the plurality of control lines are emission lines, and the control circuit is an emission driver.

9. The display device according to claim 1,
wherein the first light-emitting element and the second light-emitting element are organic EL elements.

10. A display device including a display region and a frame region provided around the display region and configured to display an image by causing first light-emitting elements provided in the display region to emit light, the display device comprising:
   a plurality of data lines to which data signals for displaying the image are supplied;
   a plurality of control lines arranged to intersect the plurality of data lines;
   a plurality of pixel circuits including the first light-emitting elements, each of the first light-emitting elements being provided at each of intersection points of the plurality of data lines and the plurality of control lines;
   a control circuit configured to activate the plurality of corresponding control lines at a timing at which the data signals are supplied to the plurality of data lines;
   second light-emitting elements provided in the frame region, each of the second light-emitting elements being provided for each of the plurality of control lines; and a first transistor including a control terminal connected to the control line or one of nodes provided in the control circuit, and a first conduction terminal connected to one of an anode electrode or a cathode electrode of one of the second light-emitting elements, wherein the other of the anode electrode or the cathode electrode of the second light-emitting element is connected to a first constant voltage source, wherein electrical signals flowing through the plurality of control lines or electrical signals flowing through the nodes are input to the second light-emitting elements, and wherein a second conduction terminal of the first transistor is connected to a second constant voltage source.

11. The display device according to claim 10 further comprising:

a second transistor including a second control terminal connected to a control signal line configured to control light emitting drive of one of the second light-emitting elements, wherein a first conduction terminal of the second transistor is connected to a second conduction terminal of the first transistor, and a second conduction terminal of the second transistor is connected to one of an anode electrode or a cathode electrode of the second light-emitting element.

12. A display device including a display region and a frame region provided around the display region and configured to display an image by causing first light-emitting elements provided in the display region to emit light, the display device comprising:

a plurality of data lines to which data signals for displaying the image are supplied;

a plurality of control lines arranged to intersect the plurality of data lines;

a plurality of pixel circuits including the first light-emitting elements, each of the first light-emitting elements being provided at each of intersection points of the plurality of data lines and the plurality of control lines;

a control circuit configured to activate the plurality of corresponding control lines at a timing at which the data signals are supplied to the plurality of data lines;

second light-emitting elements provided in the frame region, each of the second light-emitting elements being provided for each of the plurality of control lines; and a first transistor including a control terminal connected to a control line of the plurality of control lines or one of nodes provided in the control circuit, wherein electrical signals flowing through the plurality of control lines or electrical signals flowing through the nodes are input to the second light-emitting elements, wherein a first conduction terminal of the first transistor is connected to an external power supply provided externally, and a second conduction terminal of the first transistor is connected to one of an anode electrode or a cathode electrode of a second light-emitting element of the second light-emitting elements, and wherein the other of the anode electrode or the cathode electrode of the second light-emitting element is connected to a first constant voltage source.

13. The display device according to claim 12 further comprising:

a second transistor including a second control terminal connected to a control signal line configured to control light emitting drive of a second light-emitting element of the second light-emitting elements, wherein a first conduction terminal of the second transistor is connected to a second conduction terminal of the first transistor, and a second conduction terminal of the second transistor is connected to one of an anode electrode or a cathode electrode of the second light-emitting element.

\* \* \* \* \*